United States Patent [19]

Houston

[11] Patent Number: 5,313,422

[45] Date of Patent: May 17, 1994

[54] DIGITALLY CONTROLLED DELAY APPLIED TO ADDRESS DECODER FOR WRITE VS. READ

[75] Inventor: Theodore W. Houston, Richardson, Tex.

[73] Assignee: Texas Instruments Incorporated, Dallas, Tex.

[21] Appl. No.: 706,621

[22] Filed: May 29, 1991

[51] Int. Cl.[5] .............................................. G11C 7/00
[52] U.S. Cl. ................................. 365/194; 365/189.01; 365/189.04; 365/189.08; 365/221
[58] Field of Search .............. 365/194, 189.01, 189.04, 365/189.08, 221

[56] References Cited

U.S. PATENT DOCUMENTS

4,656,612  4/1987  Allan ..................................... 365/194
5,014,245  5/1991  Muroka et al. ....................... 365/194

Primary Examiner—Robert J. Pascal
Assistant Examiner—Reginald A. Ratliff
Attorney, Agent, or Firm—Rebecca A. Mapstone; James C. Kesterson; Richard L. Donaldson

[57] ABSTRACT

A digitally controlled asymmetrical delay circuit (DCADC) is described in which the amount of delay for an input transitioning in one direction (e.g. low to high) is controlled independently from the amount of delay for the input signal transitioning in the opposite direction (high to low). This digitally controlled asymmetrical delay circuit is applied to a memory address decode circuit. The DCADC is controlled by the WRITE/READ signal such that there is minimal delay when the WRITE signal is low (the READ signal is high), minimizing the delay introduced in the access time. When the WRITE signal is high (the READ signal is low), extra delay is added to the selection relative to the deselection of a memory location. In this manner, input noise during a WRITE is filtered out without slowing the access time.

16 Claims, 6 Drawing Sheets

| A | B | IN | OUT |
|---|---|----|-----|
| 0 | 0 | 0  | 1   |
| 0 | 0 | 1  | 1   |
| 0 | 1 | 0  | 1   |
| 0 | 1 | 1  | 0   |
| 1 | 1 | 0  | 0   |
| 1 | 1 | 1  | 0   |

DIGITALLY CONTROLLED DELAY APPLIED TO ADDRESS DECODER FOR WRITE VS. READ

NOTICE: The U.S. Government has a paid-up license in this invention and the right in limited circumstances to require the patent owner to license others on reasonable terms as provided for by the terms of a contract with the Defence Nuclear Agency.

FIELD OF THE INVENTION

This invention generally relates to a digitally controlled delay applied to an address decoder for WRITE vs. READ.

BACKGROUND OF THE INVENTION

Figure 1:
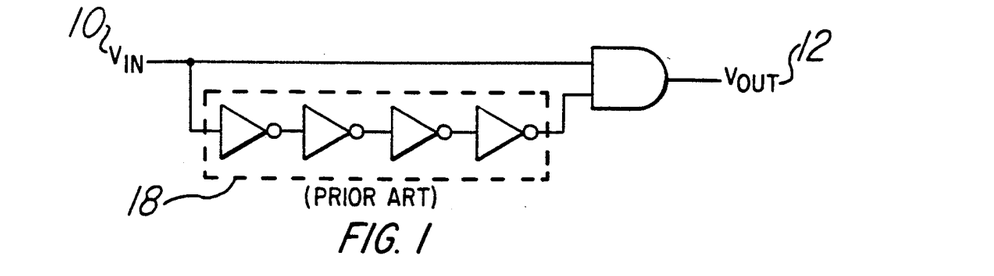
FIG. 1 is a schematic diagram of a prior art asymmetrical delay circuit.
Figure 2:
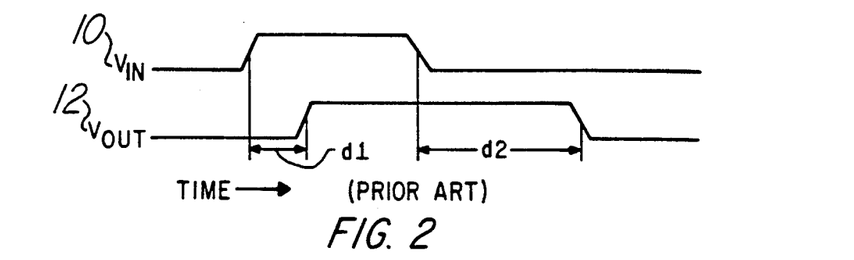
FIG. 2 is the timing diagram of the prior art asymmetrical delay circuit of FIG. 1.

Asymmetrical delay circuits, as shown in FIG. 1, are circuits which exhibit different delays, between the input signal 10 and the output signal 12, for the rising and falling edges of a digital pulse. FIG. 2 shows the timing diagram, depicting the input and output signals, of an example of a prior art asymmetrical delay. As is shown, there is some amount of delay when the input transitions from low-to-high and a different amount of delay when the input transitions from high-to-low. Asymmetrical delay circuits are sometimes used in the address decode circuitry for a memory to ensure the deselection of one memory location before selection of the next memory location. In that application, the asymmetrical delay will also prevent temporary access to an intermediate address when there is some timing skew associated with the individual address bit lines becoming set at slightly different times, if the difference in the time between select and deselect is greater than the amount of skew.

Asymmetrical delay circuits are also used to delay the enabling verses the disabling of a WRITE into a memory so that sufficient time is allowed for establishing access to the correct memory location before enabling of the WRITE.

In a memory, it may be desirable to have a slow select/fast deselect of an addressed cell during WRITE to prevent a temporarily incorrect address from being written into. But during READ, an excessively slow select is not desirable since it directly effects access time.

SUMMARY OF THE INVENTION

A digitally controlled asymmetrical delay circuit (DCADC) is described, in which the amount of delay for an input transitioning in one direction (e.g. low to high) is controlled independently from the amount of delay for the input signal transitioning in the opposite direction (high to low). For example, this digitally controlled asymmetrical delay circuit is applied to a memory address decode circuit. This example pertains to an address being selected on a low-to-high transition. The DCADC is controlled by the WRITE/READ signal such that there is minimal delay when the WRITE signal is low (the READ signal is high), minimizing the delay introduced in the access time. When the WRITE signal is high (the READ signal is low), extra delay is added to the selection relative to the deselection of a memory location.

Input noise is an undesirable signal which gets on a line and depending upon its level looks either high or low. If the line is an address line, the noise signal could change an address by showing up as a high signal when the address signal was really low or vica versa. The asymmetrical delay circuit "delays" the decoding of the address during the write for a predetermined amount of time, during which time, the noise signal may come and go, thereby maintaining the correct address for the WRITE operation.

BRIEF DESCRIPTION OF THE DRAWINGS

In the drawings.

Corresponding numerals and symbols in the different Figures refer to corresponding parts unless otherwise indicated.

DETAILED DESCRIPTION OF PREFERRED EMBODIMENTS

Figure 3:
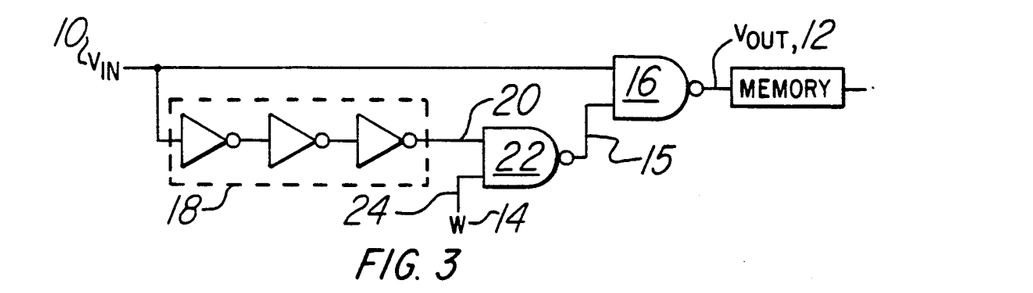
FIG. 3 is a schematic diagram the first embodiment of the digitally controlled asymmetrical delay circuit as described by this invention.

In accordance with the present invention, a digitally controlled asymmetrical delay circuit (DCADC) is described. For a DCADC, the delay from input to output depends on the value of the control signal(s) and on the direction (high-to-low or low-to-high) of the input transition. One embodiment of a DCADC is shown in FIG. 3.

The arrangement of the circuit of FIG. 3 will now be described in detail. An input 10 is simultaneously applied to one input of a first NAND circuit 16 and to a delay circuit 18. The output of the delay circuit 18 drives one input 20 of a second NAND circuit 22 while the digitally controlled WRITE signal 14 drives the second input 24 to the second NAND circuit 22. Completing the circuit, the output of the second NAND circuit 22 is the second input to the first NAND circuit 16, and the output of the first NAND circuit 16 is the output of the DCADC.

Figure 4:
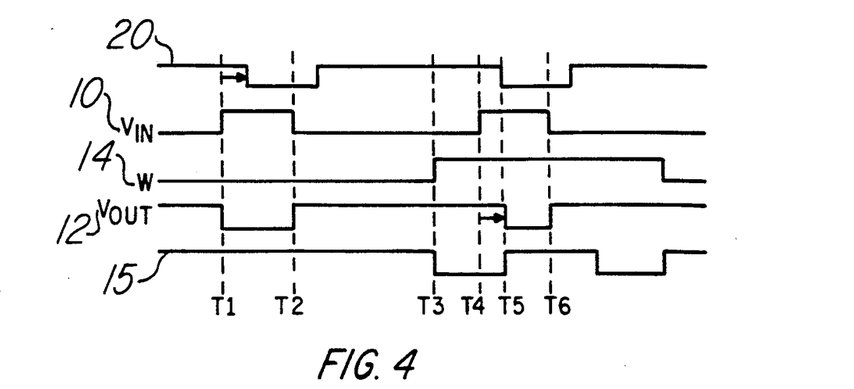
FIG. 4 is the timing diagram for first embodiment of the digitally controlled asymmetrical delay circuit as described by this invention.

The operation of the DCADC of this invention is described next with the timing diagrams of FIG. 4 to be used as a reference. When control signal 14, W, is low, internal signal 15 is high causing output 12 to respond directly to the input 10 with minimal delay as shown at times T1 and T2 on FIG. 4. However, when control signal 14 is charged to high at T3, internal signal 15 will depend on the level of signal 20 which is delayed from input signal 10. For example, assuming signal 14 switches to high at T3, when input signal 10 transitions from low-to-high at T4, and equilibrium has been established through delay circuit 18 at T5, internal signal 20 will be low, internal signal 15 will be high, and output signal 12 will be low. If input signal 10 then transitions from high-to-low at T6, the output signal 12 will transition from low-to-high with minimal delay and unaffected by delay circuit 18.

Figure 5:
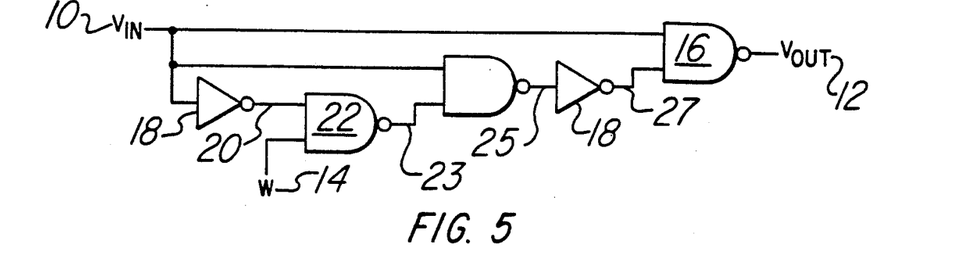
FIG. 5 is a schematic diagram of a second embodiment of the digitally controlled asymmetrical delay circuit as described by this invention.

A second embodiment of the invention is a digitally controlled asymmetrical delay circuit (DCADC) which has some asymmetrical delay when the control signal 14, W, is low, and more asymmetrical delay when the control signal 14, W, is high. This circuit arrangement is shown in FIG. 5. The timing diagrams of FIG. 6 describe the operation of the circuit in FIG. 5.

Figure 6:
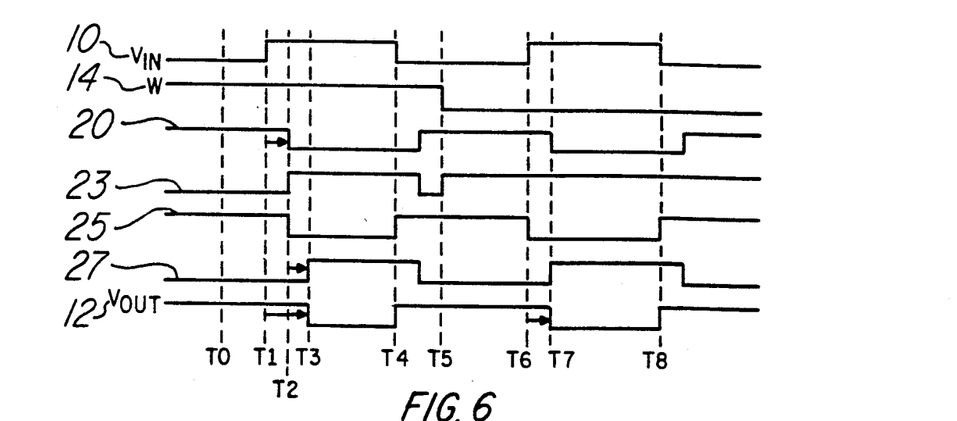
FIG. 6 is the timing diagram for second embodiment of the digitally controlled asymmetrical delay circuit as described by this invention.

When the control signal 14 is high and the input signal 10 has been low for some time, internal signal 23 will be low, internal signal 25 will be high, internal signal 27 will be low and output signal 12 will be high as shown at T0. Then when the input signal 10 transitions from low-to-high at T1, internal signal 20 is still high because it is the inverse delay of input signal 10 and once equilibrium through the delay circuit 18 has been established, signal 20 transitions from high-to-low at T2. This delay shifts the time frame of interest to T2 where internal signal 23 transitions from low-to-high, internal signal 25 transitions from high-to-low, and internal signal 27 is still low because it is the inverse delay of internal signal 25. Subsequently, once equilibrium has again been established in the second delay circuit 18 at T3, internal signal 27 transitions from low-to-high triggering the output signal 12 to transition from high-to-low. Therefore, the output signal 12 becomes the twice delayed inverted version of the input signal 10 at T3, having triggered on the input transition from low-to-high. Once the input signal 10 transitions from high-to-low and the control signal 14 is still high at T4, internal signals 20 and 23 remain the same as at T2 but internal signal 25 transitions from low-to-high. Internal signal 27 remains high until equilibrium is reached through delay circuit 18. Therefore, the output signal 12 immediately transitions from low-to-high as shown at T4. Therefore, there is no delay in the output when the input transitions from high-to-low.

However, when the control signal 14 is selected to be low at T5, internal signal 23, unaffected by the delay circuit 18, will always be high, internal signal 25 is directly the inverse of the input signal 10, and internal signal 27 is the delayed inverse of internal signal 25. Thus when the input signal 10 transitions from low to high at T6, the output signal 12 becomes the inverse of internal signal 27 or the delayed inverse of the input signal 10 when equilibrium is reached through the delay circuit 18 at T7. Then, when the input signal transitions from high-to-low and the control signal 14 is still low at T8, internal signal 27 remains high, because it is the inverse delay of internal signal 25 which immediately transitions from low-to-high, causing the output signal 12 to transition from low-to-high at T8 with minimal delay. Thus, this DCADC delays the output when the input transitions from low-to-high.

Figure 7:
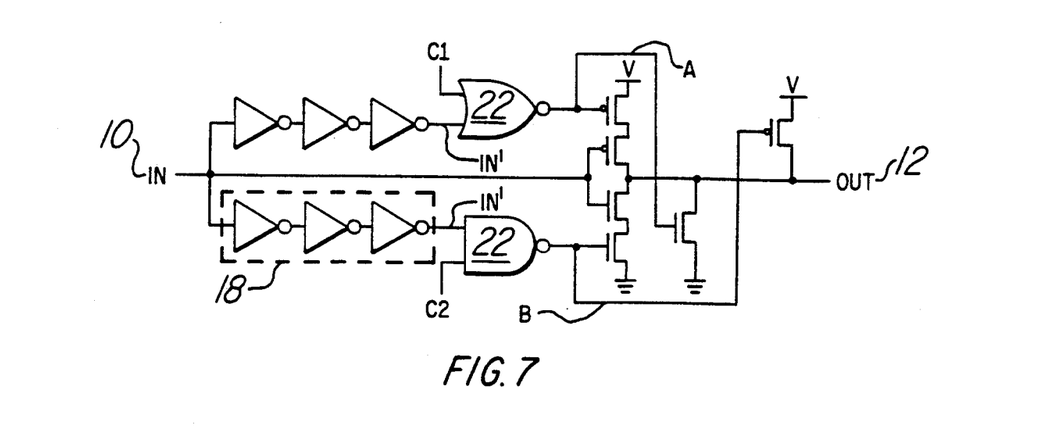
FIG. 7 is a schematic diagram of a third embodiment of the invention with two control signals, thereby controlling the delay for an input transition from low to high and from high to low.
Figure 8:
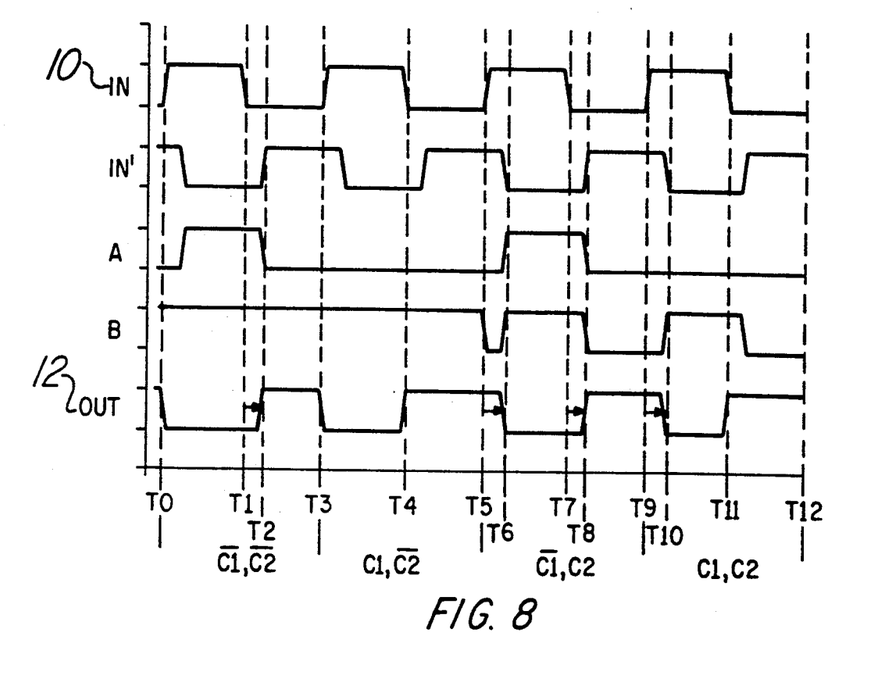
FIG. 8 is a timing diagram describing the operation of the third embodiment schematically diagrammed in FIG. 7.
Figure 9:
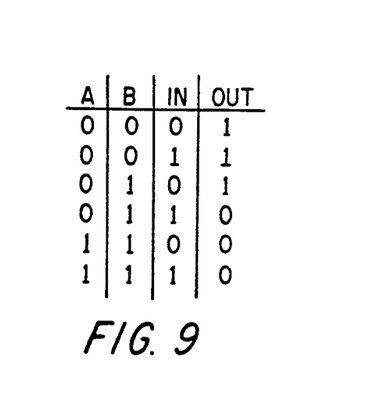
FIG. 9 is a truth table of the different possible combinations of the input and two internal signals A and B.

A third embodiment of the invention, shown in FIG. 7, is a DCADC with two control signals 13 and 14, whereby different combinations of the two control signals and the input signal yield delays for an input transition from low to high and delays for an input transition from high to low. The six different combinations of these three signals are described in the truth table of FIG. 9. The timing diagrams in FIG. 8 show the output relative to the input for all four possible combinations of the two control signals C1 and C2, in addition to internal signals IN', A and B.

For example, when control signals C1 and C2 are low, at T0, the input signal 10 transitions from low-to-high and the output signal 12 transitions from high-to-low, with no delay. However, at T1 when the input signal 10 transitions from high-to-low, the output signal 12 remains low and doesn't transition from low-to-high until T2 when the internal signal IN' transitions from low-to-high. Therefore, when both control signals are low, there is only a delay when the input is transitioning from high-to-low.

As a second example, when control signal C1 is high and control signal C2 is low at T3, there is no delay in the output signal 12 when the input signal 10 transitions from either low-to-high at T3 or high-to-low at T4.

As yet a third example, when control signal C1 is low and control signal C2 is high at T5, on both the low-to-high input signal 10 transition at T5 and the high-to-low transition at T7, the output signal 12 transitions at T6 and T8 respectively which is a delayed signal relative to the input signal 10. Therefore, when C1 is low and C2 is high, the output signal 12 is delayed on either low-to-high or high-to-low input signal 10 transition.

It's to be understood that, if control signal C1 is low and control signal C2 is high, the delays will be symmetrical instead of asymmetrical.

The last combination of control signals is when both control signals C1 and C2 are high at T9, on the low-to-high transition of the input signal at T9, the output signal 12 is delayed and transitions on T10. However, on the high-to-low input signal 10 transition at T11, the output signal 12 experiences no delay and also transitions at T11. Therefore, when both C1 and C2 are high, the output is delayed on only the low-to-high input signal 10 transition.

Figure 10:
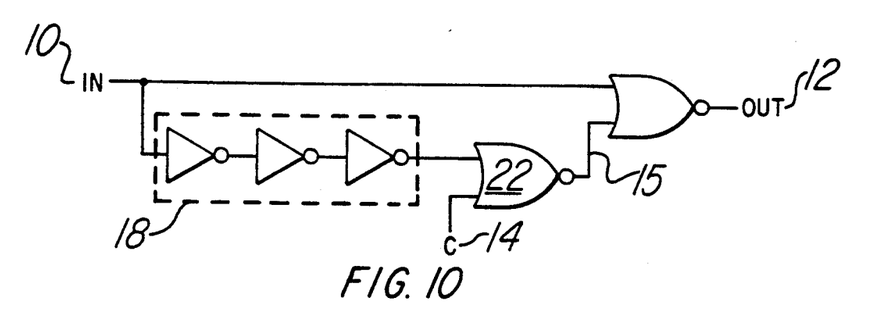
FIG. 10 is a schematic diagram of the fourth embodiment of the digital asymmetrical control delay circuit described by this invention constructed with NOR circuits.
Figure 11:
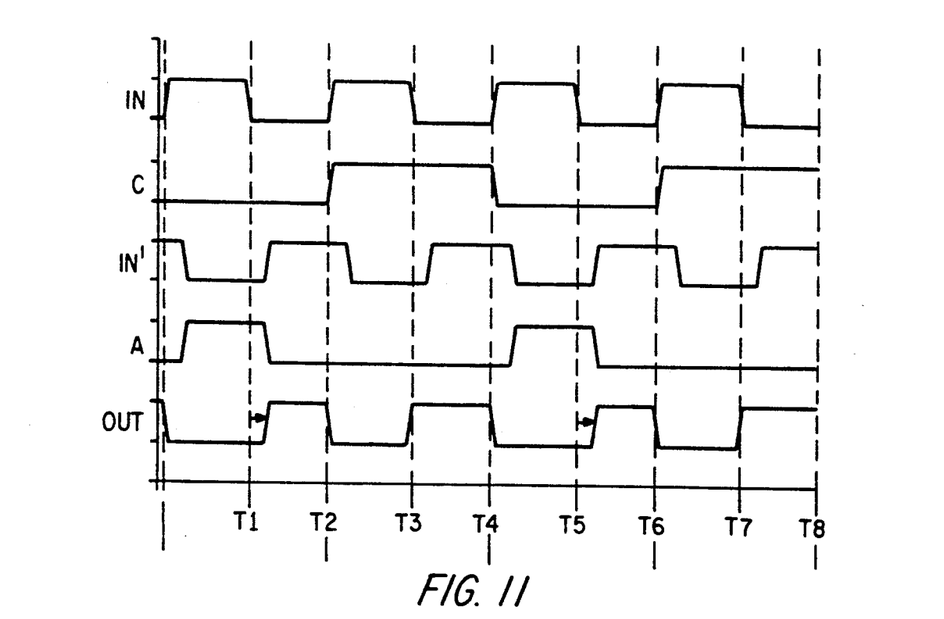
FIG. 11 is a timing diagram describing the operation of the fourth embodiment schematically diagrammed in FIG. 10.
Figure 12:
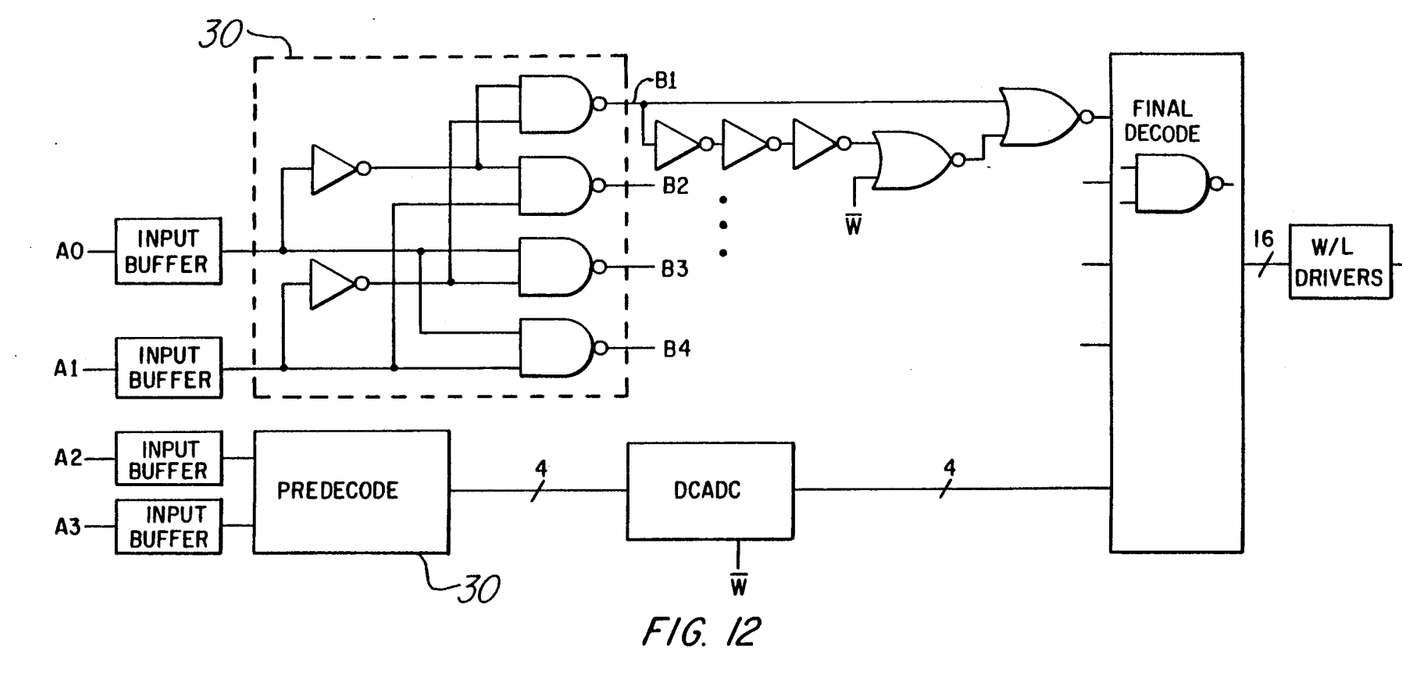
FIG. 12 is a block diagram of an address decode circuit including a DCADC controlled by the READ signal (R).

A fourth embodiment, shown in FIG. 10, is the first embodiment constructed with NOR instead of NAND circuits. As shown in the timing diagram of FIG. 11, the output signal 12 is delayed only when the control signal C is low and the input signal 10 is transitioning from high-to-low. Subsequently, the replacement of the NAND circuit with a NOR circuit yields a delayed output signal 12 on a high-to-low input signal 10 transition instead of a delayed output signal 12 on a low-to-high input signal 10 transition as occurs in the NAND DCADC. A fifth embodiment of this invention entails the use of a digitally controlled asymmetrical delay circuit (DCADC) in a predecode addressing scheme, as shown in FIG. 12. In a memory circuit, it is common to decode the input address using pre-decode blocks with the results from the predecode blocks being combined to make the final row or column selection. In this embodiment, the output from the predecode block is low for select, high for deselect. In a pre-decode block, some subset m, of the total number of address bits, n, is taken as input. The output is 2m signals such that for any combination of the input address bits, only one of the 2m outputs is selected (i.e. one high, all the others low, or vica-versa) depending on the values of the m input address bits.

For example, 4 address bits are needed to select one of 16 wordlines (W/L's). These can be arranged in two groups of 2, input address bits A0 and A1 and input address bits A2 and A3, as shown in FIG. 12. Each of the two predecoders 30 then has 4 outputs, B1, B2, B3, and B4. The total of 8 predecoder outputs, B1 through B8, are then taken two at a time, one from the first predecoder, outputs B1 through B4, and one from the second decoder, outputs B5 through B8, to form the 16 unique combinations to select the W/L (i.e. B1B5, B1B6, B1B7, etc.) Since one of each of the decoders outputs B1 through B4, or B5 through B8, will be high (or low) at a time, there will only be one combination of both the decoder outputs where both decoder outputs will be high (or low) and that is the W/L selected.

For larger memories, the difference in the number of predecode outputs and number of W/Ls is greater. For example, 128 W/L requires 7 address bits that could be predecoded in groups of 3, 3, and 1. This would give predecode outputs of 8 (2**3=8), 8, and 2, for a total of 18 compared to 128 W/Ls. Therefore, the predecoded output is a good place to insert the digitally controlled asymmetrical delay since it has the property of high selects, low deselects (or vica-versa) (this is compared to the individual address bit where high or low, some W/L will be selected), and a lot fewer DCADCs will be needed than if inserted at the W/L driver. Also, it is common that some inverters are inserted between the predecode and the final decode to boost the drive. The DCADC can take the place of one of these inverters. In accordance with this embodiment of the present invention, a DCADC is applied such that the delay of selection of a memory location relative to deselection is made larger in WRITE than READ to protect against false WRITE and simultaneously not slow READ. The operation of this embodiment is described in more detail in the first embodiment depicted in FIGS. 3 and 4.

Figure 13:
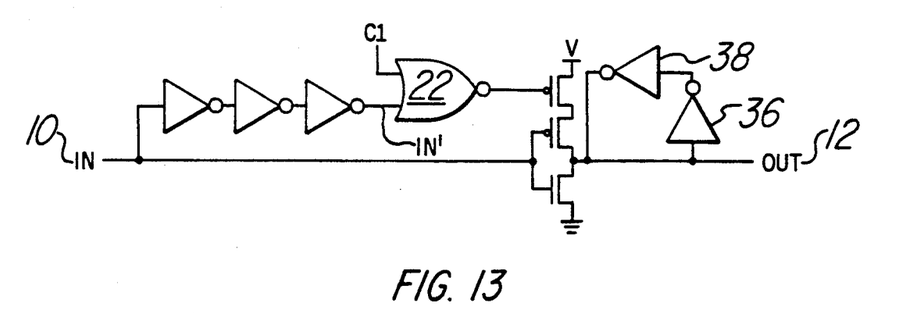
FIG. 13 is a schematic diagram of the a digitally controlled asymmetrical delay which delays a low-to-high input signal transition when the control signal C1 is low.
Figure 14:
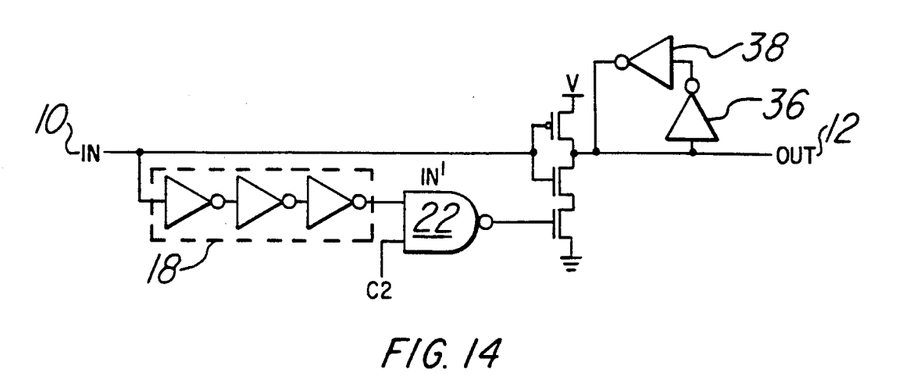
FIG. 14 is a schematic diagram of the a digitally controlled asymmetrical delay which delays a high-to-low input signal transition when the control signal C2 is high.
Figure 15:
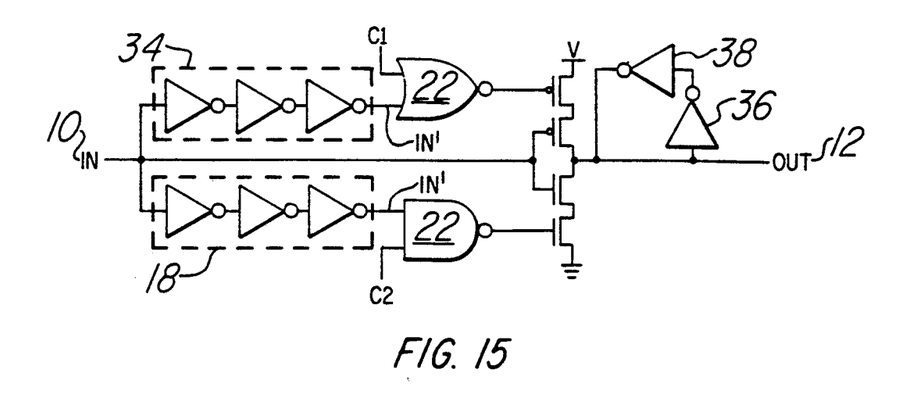
FIG. 15 is a schematic diagram of the a digitally controlled asymmetrical delay which delays a low-to-high input signal transition when the control signal C1 is low and which delays a high-to-low input signal transition when the control signal C2 is high.

A sixth embodiment uses a logic gate with a selectable high impedance output (tri-state). The circuits in FIGS. 13 and 14 have controls that delay either a high-to-low input signal 10 transition, FIG. 13, or a low-to-high input signal 10 transition, FIG. 14. For example, the output signal 12 of FIG. 13 is delayed when the control signal C1 is low, and the input signal 10 is transitioning from high-to-low. As another example, the output signal 12 of FIG. 14 is delayed when the control signal C2 is high and the input signal 10 is transitioning from low-to-high. The circuit of FIG. 15 is a combination of the circuits of FIGS. 13 and 14 wherein the output signal 12 is delayed when C1 is low and the input signal 10 is transitioning from high-to-low, and when C2 is high and the input signal is transitioning from low-to-high. In these three FIGS. 13, 14, and 15, the two inverters 36 and 38 on the output form a latch to hold the level of the output when the preceding stage is in a high impedance state (tri-state), and is to be reset by the preceding stage when that stage is driving either high or low. Other latch circuits could be used, or if there is sufficient capacitance on the output node, the latch can be omitted.

Other extensions of the invention include the use of multiple control signals either to control a single delay or to control multiple delays.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, different delay elements could be used, and different combinations of NAND or NOR logic could be used. Also, different address decode circuits could be used, and the DCADC could be placed in different portions of the decode circuit. It is therefore intended that the appended claims encompass any such modifications or embodiments.

What is claimed is:

1. An address buffer circuit, having a digitally controlled delay comprising:
    a first logic circuit, connected to receive an address signal input;
    a second logic circuit, having a digital WRITE/-READ control signal input;
    a delay circuit wherein said delay circuit output is coupled to said second logic circuit, and wherein said address signal is coupled to said delay circuit, and;
    wherein the output of said second logic circuit is coupled to said first logic circuit and wherein further said address signal is an output signal from an address pre-decode circuitry in a memory.

2. The address buffer circuit of claim 1, wherein said first logic circuit drives an address decoder.

3. The address buffer circuit of claim 1, wherein said logic circuit is a NAND circuit.

4. The address buffer circuit of claim 1, wherein said delay circuit is at least one inverter.

5. The address buffer circuit of claim 1, wherein said logic circuit is a NOR circuit.

6. The address buffer circuit of claim 1, wherein said delay circuit is an asymmetrical delay circuit.

7. A digitally controlled delay circuit comprised of:
    a first logic circuit, for driving a memory access circuit, connected to receive an input signal, wherein said input signal is an output from predecode circuitry;
    a second logic circuit, connected to receive a digital control signal;
    a delay circuit wherein said delay circuit output is coupled to said second logic circuit, and wherein said input signal is coupled to said delay circuit, and;

wherein the output of said second logic circuit is coupled to said first logic circuit.

8. The digitally controlled delay circuit of claim 7, wherein said digitally controlled delay circuit is an asymmetrical delay circuit.

9. The digitally controlled delay circuit of claim 7, wherein at least said first logic circuit is a NAND circuit.

10. The digitally controlled delay circuit of claim 7, wherein said delay circuit is at least one inverter.

11. The digitally controlled delay circuit of claim 7, wherein at least said first logic circuit is a NOR circuit.

12. The digitally controlled delay circuit of claim 7, wherein said digital control signal selectively enables a delay in the selection of a memory cell.

13. The digitally controlled delay circuit of claim 7, wherein said digital control signal is a WRITE/READ enable signal.

14. The digitally controlled delay circuit of claim 7, wherein said output of said first logic circuit is coupled to an address decode circuit.

15. The digitally controlled asymmetrical delay circuit of claim 12, wherein said enabled delay is greater during WRITE than during READ.

16. The method of forming an address buffer circuit, having a digitally controlled delay, comprising the steps of:
providing an input signal to a predecode circuit for generating an address signal;
providing a WRITE/READ signal;
applying said address signal to a delay circuit and one input of a first, at least two input, logic device;
applying said WRITE/READ signal to one input of a second, at least two input, logic device;
applying the output of said delay circuit to a second input of said second logic device;
applying the output of said second logic device to a second input of said first logic device, and;
applying the output of said first logic device to circuitry for selection of a memory element.

* * * * *